US011125811B2

(12) United States Patent
Lee et al.

(10) Patent No.: US 11,125,811 B2
(45) Date of Patent: Sep. 21, 2021

(54) SEMICONDUCTOR DEVICE AND METHOD OF OPERATING THE SAME

(71) Applicant: Samsung Electronics Co., Ltd., Suwon-si (KR)

(72) Inventors: Jeong-Goo Lee, Seoul (KR); Dae Han Kim, Seoul (KR); Ji Yun Kim, Seoul (KR); Jin Yub Lee, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 108 days.

(21) Appl. No.: 16/441,370

(22) Filed: Jun. 14, 2019

(65) Prior Publication Data
US 2020/0166567 A1 May 28, 2020

(30) Foreign Application Priority Data
Nov. 23, 2018 (KR) .................. 10-2018-0145938

(51) Int. Cl.
G01R 31/3187 (2006.01)
G01R 31/28 (2006.01)
H01L 21/66 (2006.01)
G01R 31/26 (2020.01)

(52) U.S. Cl.
CPC ..... *G01R 31/2856* (2013.01); *G01R 31/2642* (2013.01); *G01R 31/2884* (2013.01); *H01L 22/34* (2013.01)

(58) Field of Classification Search
CPC ............ G01R 31/2856; G01R 31/2884; G01R 31/2874; G01R 31/2879; G01R 31/2642; G01R 31/275; G01R 31/261; G01R 31/2621; G01R 31/2617; G01R 31/129; G01R 31/2639; G01R 31/3012; G01R 31/3004
See application file for complete search history.

(56) References Cited

U.S. PATENT DOCUMENTS

| 6,724,214 | B2 | 4/2004 | Manna et al. | |
|---|---|---|---|---|
| 7,403,026 | B2* | 7/2008 | Kerber | G01R 19/175 324/750.3 |
| 7,683,653 | B2* | 3/2010 | Valentian | G01R 31/2642 326/16 |
| 8,680,883 | B2 | 3/2014 | Cho et al. | |
| 9,037,928 | B2 | 5/2015 | Klevetand et al. | |
| 9,702,926 | B2 | 7/2017 | Uppal et al. | |
| 9,778,313 | B2 | 10/2017 | Chen et al. | |
| 10,012,687 | B2 | 7/2018 | Uppal | |
| 2002/0033710 | A1* | 3/2002 | Kim | G01R 31/129 324/762.09 |

(Continued)

FOREIGN PATENT DOCUMENTS

JP 2001-127126 A 5/2001

*Primary Examiner* — Thang X Le
(74) *Attorney, Agent, or Firm* — Harness, Dickey & Pierce, P.L.C.

(57) ABSTRACT

Provided are a semiconductor device and a method of operating the same. A semiconductor includes a test circuit which comprises: a test transistor to be tested for time-dependent dielectric breakdown (TDDB) characteristics using a stress voltage; an input switch disposed between a voltage application node to which the stress voltage is applied and an input node which transmits the stress voltage to the test transistor; and a protection switch disposed between the input node and a ground node.

18 Claims, 12 Drawing Sheets

(56) References Cited

U.S. PATENT DOCUMENTS

2009/0267634 A1* 10/2009 Nada .................. G01R 31/2628
324/762.09
2010/0252828 A1* 10/2010 Grillberger ........... H01L 23/585
257/48

* cited by examiner

SEMICONDUCTOR DEVICE AND METHOD OF OPERATING THE SAME

This application claims the benefit of Korean Patent Application No. 10-2018-0145938, filed on Nov. 23, 2018, in the Korean Intellectual Property Office, the disclosure of which is incorporated herein in its entirety by reference.

BACKGROUND

1. Field

The inventive concepts of the present disclosure relate to a semiconductor device and a method of operating the same.

2. Description of the Related Art

Time-dependent dielectric breakdown (TDDB) may explain a breakdown that may occur when a dielectric such as a gate oxide layer receives a relatively low electric field for a long period of time. To test TDDB characteristics of a semiconductor element such as a transistor, the breakdown time of a gate oxide layer may be measured by applying a high stress voltage to the gate oxide layer until the gate oxide layer breaks down. Then, the breakdown time of a semiconductor device operating at a user voltage may be estimated based on the measured breakdown time.

If a test transistor used to test the TDDB characteristics breaks down, a main circuit of a chip may be damaged. Therefore, the test transistor may not be formed on a die. Instead, the test transistor may be formed on a tag area of a wafer where no die is formed and then tested for the TDDB characteristics. In this method, since the TDDB characteristic test is performed only in the tag area, the number of data that may be obtained is limited.

SUMMARY

Some example embodiments of the inventive concepts provide a method of forming a test circuit for testing time-dependent dielectric breakdown (TDDB) characteristics on a die in an on-chip manner while reducing or preventing damage to a main circuit adjacent to the test circuit.

However, embodiments of the inventive concepts are not restricted to the ones set forth herein. The above and other embodiments of the inventive concepts will become more apparent to one of ordinary skill in the art to which the inventive concepts pertain by referencing the detailed description of the inventive concepts given below.

According to some example embodiments of the inventive concepts, there is provided a semiconductor device including a test circuit which includes a test transistor to be tested for time-dependent dielectric breakdown (TDDB) characteristics using a stress voltage; an input switch between a voltage application node to which the stress voltage is applied and an input node electrically connected to the test transistor; and a protection switch between the input node and a ground node.

According to some example embodiments of the inventive concepts, there is provided a semiconductor device including a test circuit comprising a test transistor to be tested for TDDB characteristics using a stress voltage, and an input switch between a voltage application node to which the stress voltage is applied and an input node electrically connected to the test transistor; and a main circuit adjacent to the test circuit and electrically isolated from the test circuit.

According to some example embodiments of the inventive concepts, there is provided a semiconductor device including a test circuit comprising a first test pattern comprising a first input switch and a first protection switch, and a second test pattern comprising a second input switch and a second protection switch; and a main circuit on a die, the main circuit configured to operate a chip, wherein the test circuit is on the die and is electrically isolated from the main circuit, the first input switch is between a first voltage application node to which a first stress voltage is applied and a first input node electrically connected to a first test transistor to be tested for TDDB characteristics, the first protection switch is between the first input node and a first ground node, the second input switch is between a second voltage application node to which a second stress voltage different from the first stress voltage is applied and a second input node configured to transmit the second stress voltage to a second test transistor to be tested for the TDDB characteristics, and the second protection switch is between the second input node and a second ground node.

According to some example embodiments of the inventive concepts, there is provided a method of operating a semiconductor device including turning on a first input switch between a first voltage application node and a first input node, and performing a first stress operation and a first verify operation on a first test transistor to be tested for TDDB characteristics by applying a first stress voltage to the first voltage application node; and connecting a first gate, first source, first drain and first body of the first test transistor to a first ground node by turning on a first protection switch between the first input node and the first ground node after completing the first stress operation and the first verify operation on the first test transistor, wherein first the first input node is between the first input switch and the first test transistor.

BRIEF DESCRIPTION OF THE DRAWINGS

The inventive concepts will become apparent and more readily appreciated from the following description of the example embodiments, taken in conjunction with the accompanying drawings in which.

DETAILED DESCRIPTION

Figure 1:
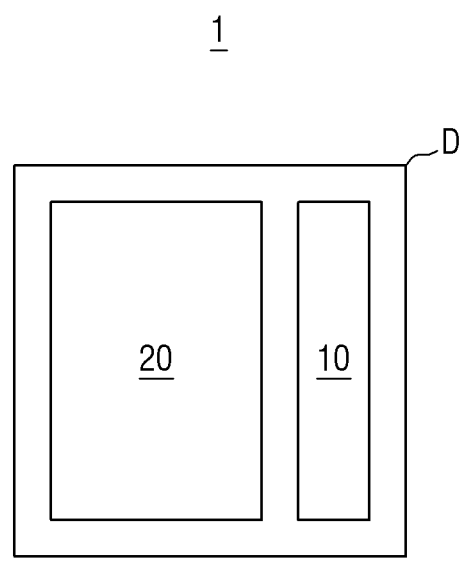
FIGS. 1 and 2 are schematic views of a semiconductor device according to some example embodiments.
Figure 2:
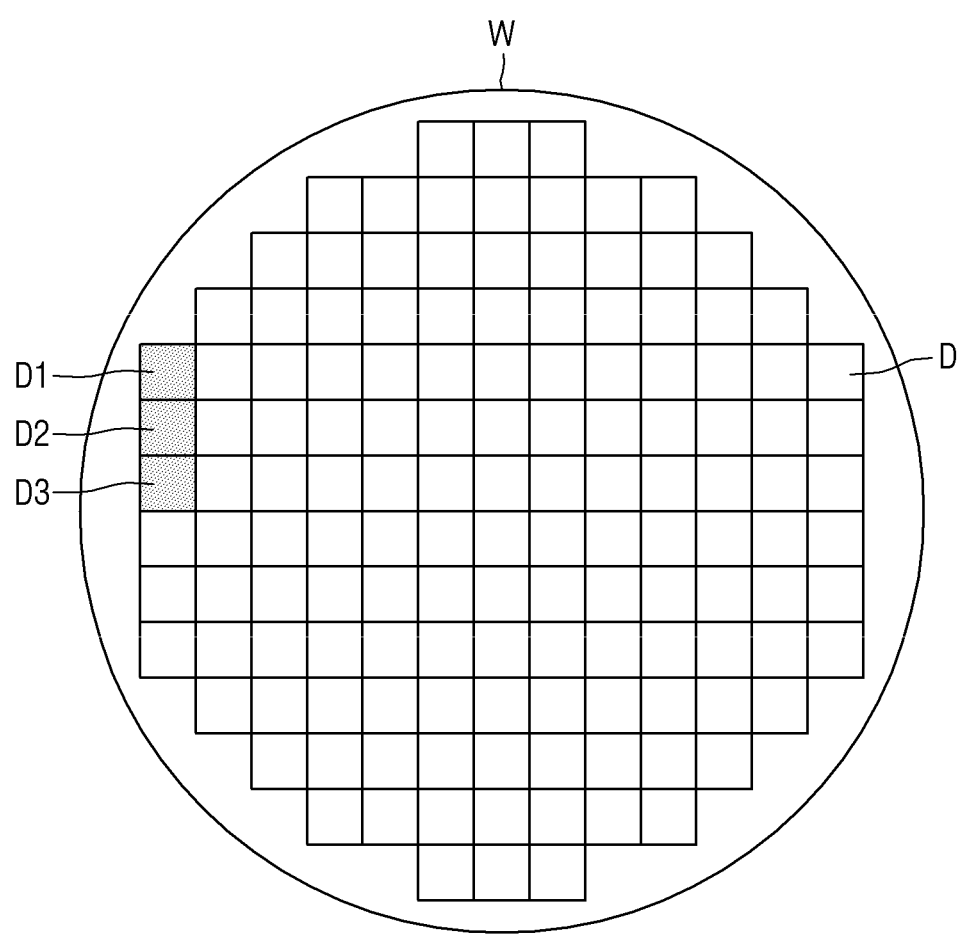

FIGS. 1 and 2 are schematic views of a semiconductor device 1 according to some example embodiments.

Referring to FIG. 1, the semiconductor device 1 according to some example embodiments includes a die D including a test circuit 10 and a main circuit 20. Here, the main circuit 20 is a circuit for operating a chip, and the test circuit 10 is a circuit for testing time-dependent dielectric breakdown (TDDB) characteristics using a stress voltage. That is, in some example embodiments, the test circuit 10 is disposed on the same die D as the main circuit 20.

Referring also to FIG. 2, a plurality of dies D may be formed on a wafer W. Semiconductor elements may be formed on the dies D, respectively, and the dies D having the semiconductor elements may be sliced and separated into a plurality of chips. Then, each of the chips may be packaged and completed as a product.

To test the TDDB characteristics, the test circuit 10 breaks down a gate oxide layer of a test transistor by applying a stress voltage generally higher than a user voltage to the test transistor. However, since the test circuit 10 is disposed on the same die D as the main circuit 20, if the test transistor of the test circuit 10 breaks down, the main circuit 20 may be damaged. In some example embodiments, the test circuit 10 is electrically isolated from the main circuit 20 in order to reduce or remove the above risk.

Further, switches for more surely reducing or preventing the damage to the main circuit 20 may be implemented in the test circuit 10. This will be described in detail with reference to the following drawings including FIG. 3.

If the risk of damage to the main circuit 20 due to the test circuit 10 is reduced or removed according to some example embodiments, data on the TDDB characteristics may be obtained for each of all dies (D1, D2, D3) on the wafer W, as illustrated in FIG. 2. This is an improvement from a situation where only a limited number of data may be obtained, for example, when the test circuit 10 is implemented in an off-die area (e.g., a tag area) of the wafer W. According to some example embodiments, a TDDB characteristic test may be performed more accurately and precisely.

Ways to more surely reduce or prevent the damage to the main circuit 20 will now be described with reference to FIG. 3.

Figure 3:
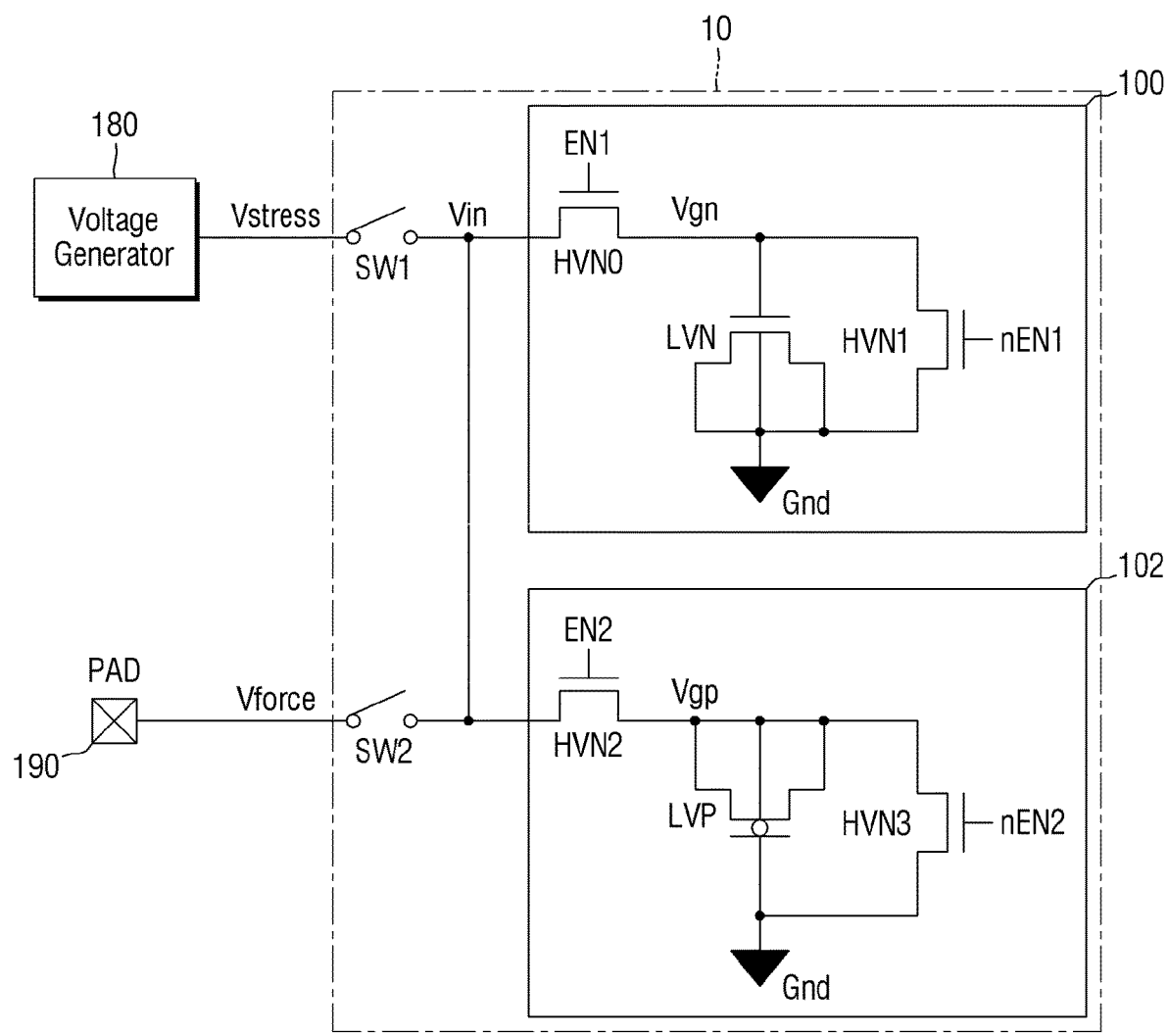
FIG. 3 is a circuit diagram of the semiconductor device according to some example embodiments.

FIG. 3 is a circuit diagram of the semiconductor device 1 according to some example embodiments.

Referring to FIG. 3, the semiconductor device 1 according to some example embodiments may include a test circuit 10, one or more test patterns 100 and 102, a voltage generator circuit 180, and/or a chip pad 190.

The test circuit 10 is a circuit for testing the TDDB characteristics of a transistor LVN using a stress voltage Vstress. Since a test transistor used in a TDDB characteristic test may no longer be used if it breaks down, the test circuit 10 may include a number of test transistors. In the present specification, a part of a circuit including each test transistor included in the test circuit 10 will be referred to as the test pattern 100 or 102.

In some example embodiments, the test pattern 100 of the test circuit 10 further includes an input switch HVN0 and a protection switch HVN1, in addition to the test transistor LVN. The test pattern 102 further includes an input switch HVN2 and a protection switch HVN3, in addition to a test transistor LVP.

Since a description of the test pattern 100 is applicable to the configuration and operation of the test pattern 102, a redundant description will be omitted, and only the test pattern 100 will be described in detail.

The input switch HVN0 is disposed between a voltage application node Vin and an input node Vgn. Here, the stress voltage Vstress is applied to the voltage application node Vin, and the input node Vgn transmits the stress voltage Vstress to the test transistor LVN.

The input switch HVN0 may be implemented using a transistor. However, the scope of the inventive concepts is not limited to this case, and the input switch HVN0 may be implemented using any semiconductor element that may selectively connect the voltage application node Vin and the input node Vgn. If the input switch HVN0 is implemented using a transistor, the transistor may be gated to an input switch enable signal EN1.

Specifically, the input switch HVN0 may selectively connect the voltage application node Vin and the input node Vgn according to the value of the input switch enable signal EN1. For example, when the value of the input switch enable signal EN1 is logic high, the input switch HVN0 may electrically connect the voltage application node Vin to the input node Vgn. On the other hand, when the value of the input switch enable signal EN1 is logic low, the input switch HVN0 may electrically disconnect the voltage application node Vin from the input node Vgn.

In particular, in some example embodiments, the input switch enable signal EN1 may have the value of logic high when a stress operation is performed on the test transistor LVN (in other words, when an operation of applying the stress voltage Vstress to the test transistor LVN is performed), thereby turning on the input switch HVN0.

Further, in some example embodiments, the input switch enable signal EN1 may also have the value of logic high when a verify operation is performed on the test transistor LVN (in other words, when an operation of verifying whether the test transistor LVN has broken down is performed), thereby turning on the input switch HVN0. The verify operation is generally performed as a subsequent operation of the stress operation.

In some example embodiments, the input switch HVN0 may include a gate oxide layer thicker than a gate oxide layer of the test transistor LVN. Accordingly, the input switch HVN0 may provide the stress voltage Vstress to the test transistor LVN exactly at a desired time under the control of the input switch enable signal EN1. Therefore, the accuracy of the TDDB characteristic test may be further increased.

Next, the protection switch HVN1 is disposed between the input node Vgn and a ground node Gnd. Here, some terminals of the test transistor LVN may be connected to the input node Vgn, and the other terminals of the test transistor LVN may be connected to the ground node Gnd.

The protection switch HVN1 may be implemented using a transistor. However, the scope of the inventive concepts is not limited to this case, and the protection switch HVN1 may be implemented using any semiconductor element that may selectively connect the input node Vgn and the ground node Gnd. If the protection switch HVN1 is implemented using a transistor, the transistor may be gated to a protection switch enable signal nEN1.

Specifically, the protection switch HVN1 may selectively connect the input node Vgn and the ground node Gnd according to the value of the protection switch enable signal nEN1. For example, when the value of the protection switch enable signal nEN1 is logic high, the protection switch HVN1 may electrically connect the input node Vgn to the ground node Gnd. On the other hand, when the value of the protection switch enable signal nEN1 is logic low, the protection switch HVN1 may electrically disconnect the input node Vgn from the ground node Gnd.

In particular, in some example embodiments, the protection switch HVN1 may connect four nodes (e.g., a gate, a source, a drain and a body) of the test transistor LVN to the ground node Gnd after the completion of the stress operation and the verify operation described above. The four nodes of the test transistor LVN are connected to the ground node Gnd in order to reduce or prevent leakage current from flowing through the test transistor LVN that has broken down. Therefore, the damage to the main circuit 20 may be more surely reduced or prevented.

In some example embodiments, the protection switch enable signal nEN1 may be implemented as an inverted signal of the input switch enable signal EN1. That is, when the input switch enable signal EN1 is logic high, the protection switch enable signal nEN1 may be logic low. Conversely, when the input switch enable signal EN1 is logic low, the protection switch enable signal nEN1 may be logic high. Accordingly, when the input switch HVN0 is turned on, the protection switch HVN1 may be turned off. Conversely, when the input switch HVN0 is turned off, the protection switch HVN1 may be turned on.

In some example embodiments, the protection switch HVN0 may include a gate oxide layer thicker than the gate oxide layer of the test transistor LVN. Therefore, the protection switch HVN1 may further increase the accuracy of the TDDB characteristic test.

The voltage generator circuit 180 generates the stress voltage Vstress of a preset voltage level and applies the stress voltage Vstress to the voltage application node Vin. In this case, the test circuit 10 may further include a first switch SW1 disposed between the voltage generator circuit 180 and the voltage application node Vin, and the first switch SW1 may selectively transmit the stress voltage Vstress to the voltage application node Vin.

Like the input switch HVN0 and the protection switch HVN1 described above, the first switch SW1 may include a transistor including a gate oxide layer thicker than the gate oxide layer of the test transistor LVN.

The chip pad 190 may be one of the various pads included in a die D, and a user stress voltage Vforce may be received from an external source through the chip pad 190. Although the stress voltage Vstress generated by the voltage generator circuit 180 and the user stress voltage Vforce received through the chip pad 190 are expressed by different terms for ease of description, the two voltages are only different in that they are supplied from different sources but have substantially the same function in that they are intended for the stress operation on the test transistor LVN.

The test circuit 10 may further include a second switch SW2 disposed between the chip pad 190 and the voltage application node Vin, and the second switch SW2 may selectively transmit the user stress voltage Vforce to the voltage application node Vin.

Like the input switch HVN0 and the protection switch HVN1 described above, the second switch SW2 may include a transistor including a gate oxide layer thicker than the gate oxide layer of the test transistor LVN.

In some example embodiments, the semiconductor device 1 is illustrated as including both the voltage generator circuit 180 and the chip pad 190 for ease of description. However, depending on the specific purpose of implementation, the semiconductor device 1 according to the inventive concepts may include only the voltage generator circuit 180 and the first switch SW1 and may not include the second switch SW2 or may include only the second switch SW2 connected to the chip pad 190 and may not include the voltage generator circuit 180 and the first switch SW1.

Figure 4:
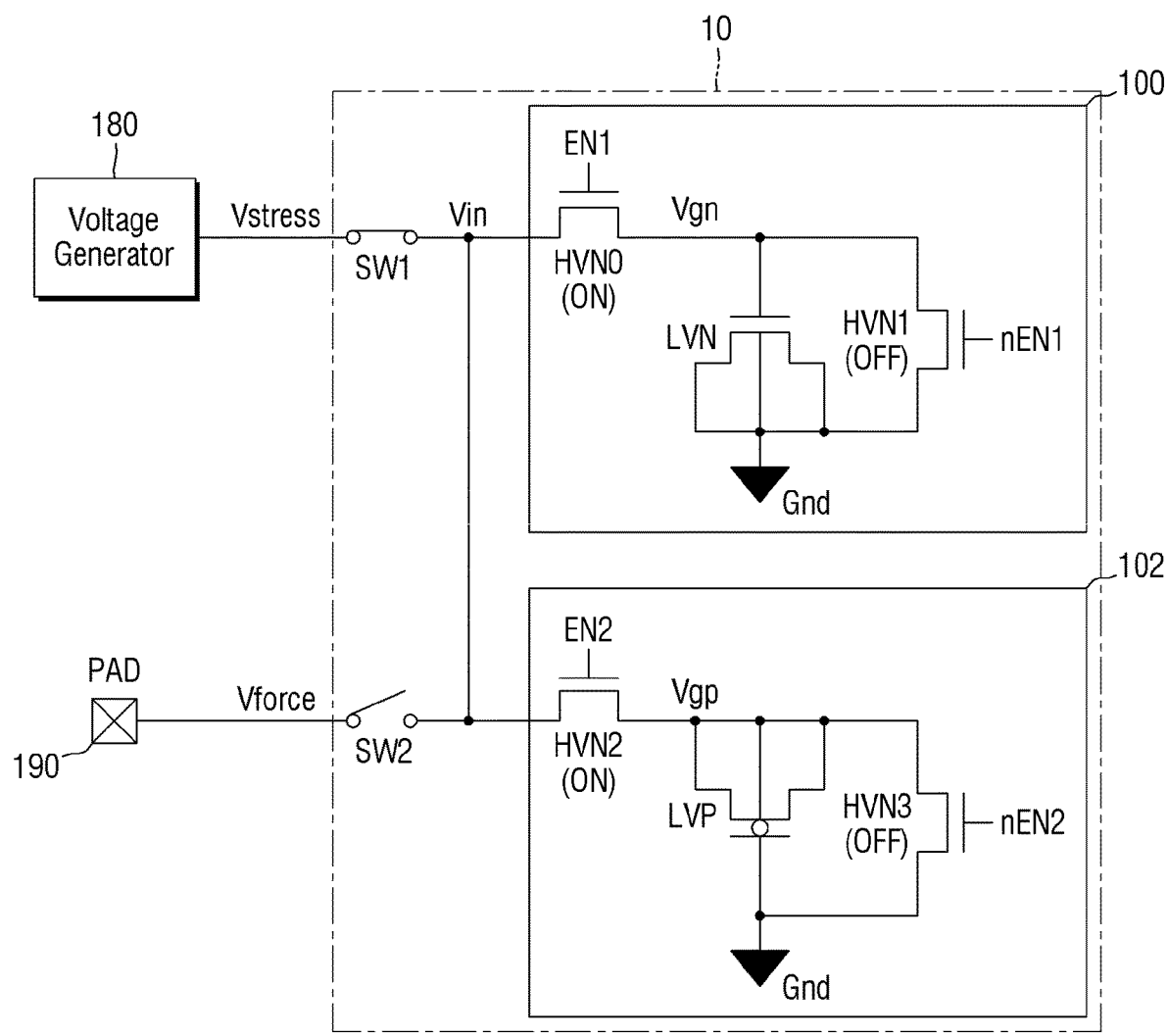
FIGS. 4 through 6 are diagrams for explaining an operation example of the semiconductor device according to some example embodiments.
Figure 5:
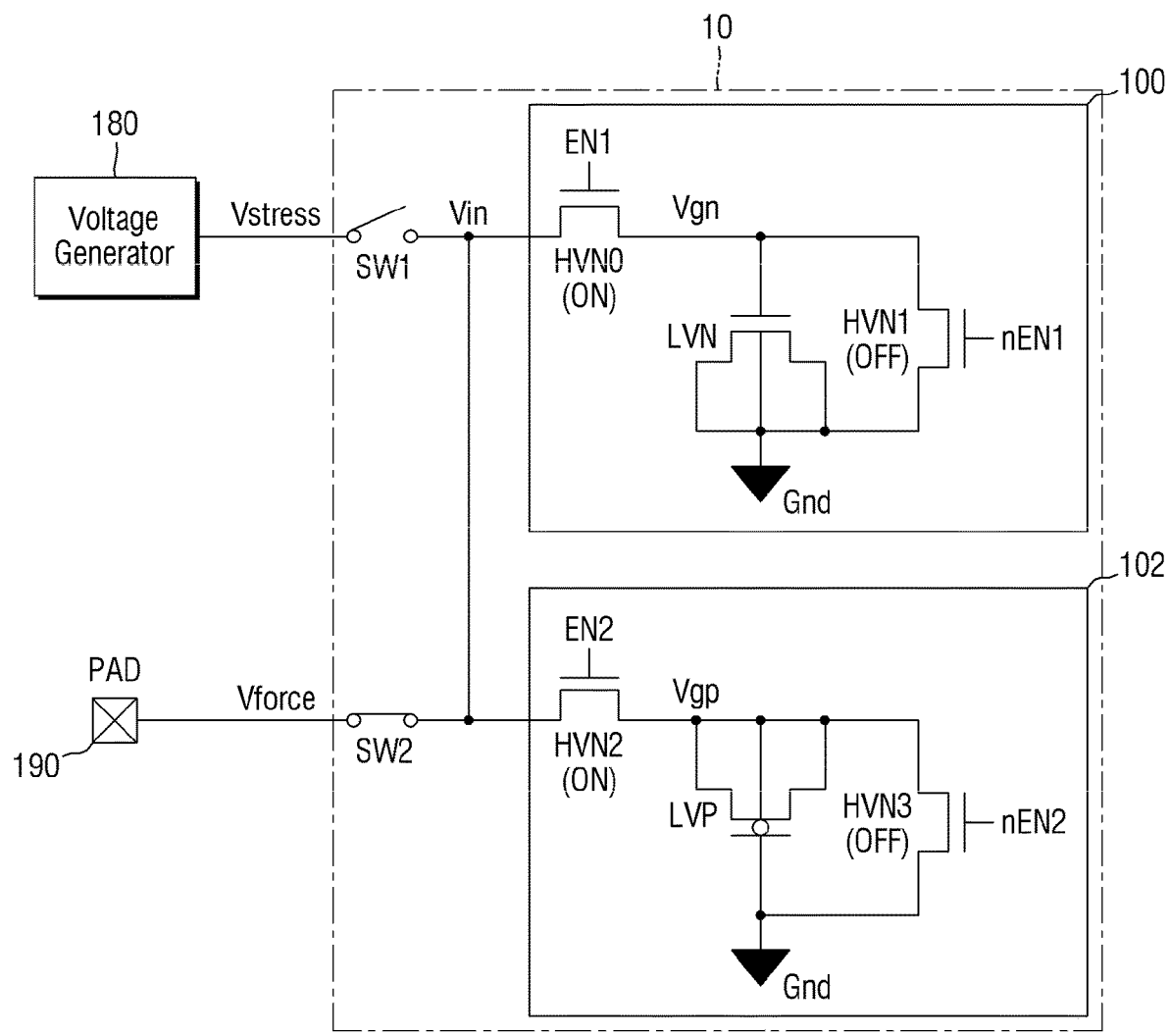
Figure 6:
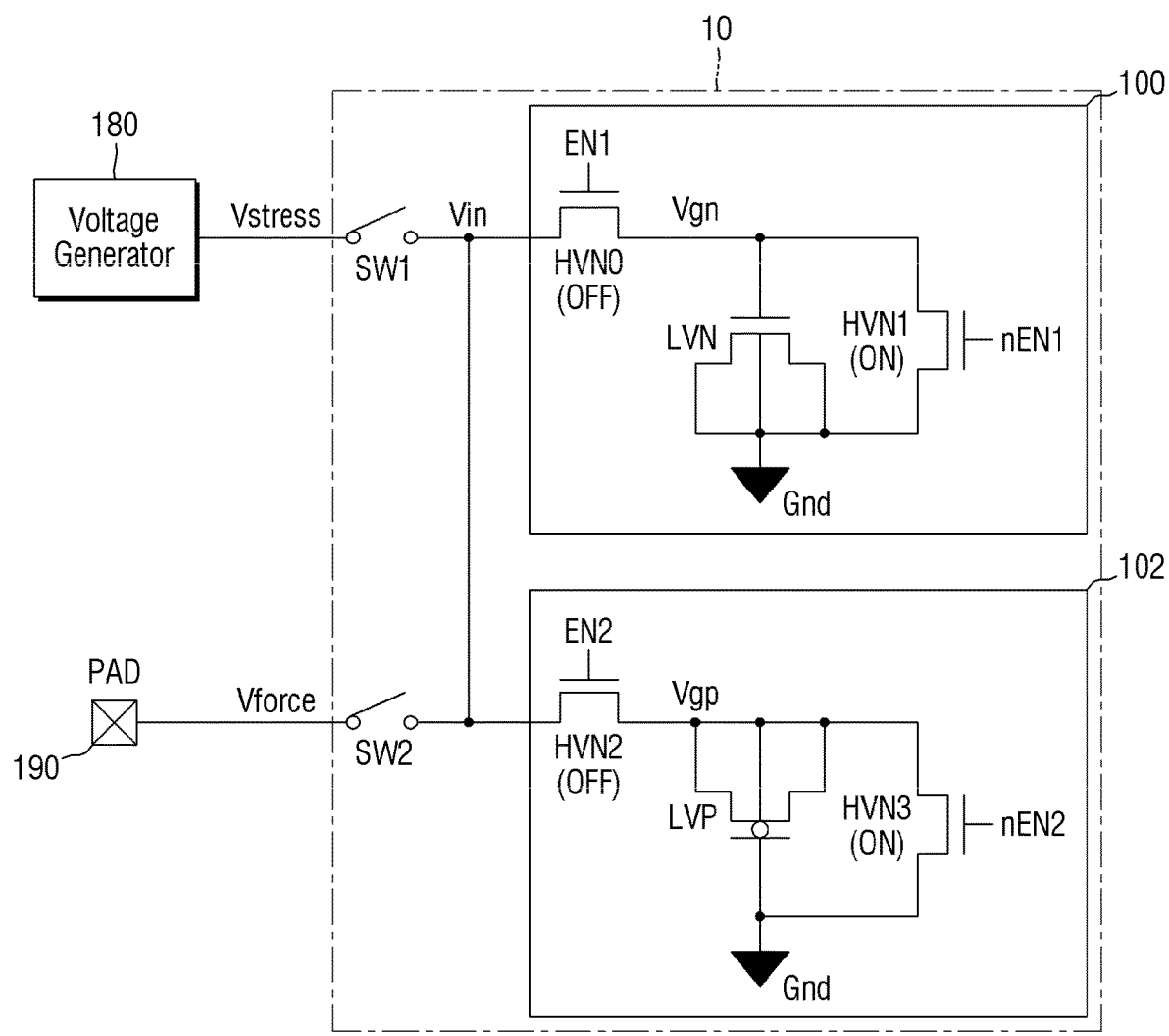

FIGS. 4 through 6 are diagrams for explaining an operation example of the semiconductor device 1 according to some example embodiments.

First, referring to FIG. 4, the semiconductor device 1 according to some example embodiments may receive the stress voltage Vstress from the voltage generator circuit 180. That is, when a stress operation is performed on the test transistor LVN, the first switch SW1 may be closed to transmit the stress voltage Vstress to the voltage application node Vin.

In addition, the input switch enable signal EN1 may have the value of logic high. Accordingly, the input switch HVN0 may be turned on to transmit the stress voltage Vstress applied to the voltage application node Vin to the input node Vgn.

Thus, a TDDB characteristic test may be performed on the test transistor LVN. Here, the TDDB characteristic test may include the stress operation and the verify operation described above. Specifically, the TDDB characteristic test on the test transistor LVN may be performed multiple times, and the stress operation for applying the stress voltage Vstress and the verify operation for verifying whether the test transistor LVN has broken down after the stress operation may be performed on the test transistor LVN multiple times until the test transistor LVN breaks down.

In the some example embodiments, the protection switch enable signal nEN1 may have the value of logic low. Accordingly, the protection switch HVN1 may be turned off.

Referring to FIG. 5, unlike in the example embodiments of FIG. 4, the semiconductor device 1 according to some example embodiments may receive the user stress voltage Vforce from the chip pad 190. When a stress operation is performed on the test transistor LVN, the second switch SW2 may be closed to transmit the user stress voltage Vforce to the voltage application node Vin.

In addition, the input switch enable signal EN1 may have the value of logic high as described in FIG. 4. Accordingly, the input switch HVN0 may be turned on to transmit the user stress voltage Vforce applied to the voltage application node Vin to the input node Vgn.

Thus, a TDDB characteristic test may be performed on the test transistor LVN. Specifically, the TDDB characteristic test on the test transistor LVN may be performed multiple times, and the stress operation for applying the user stress voltage Vforce and the verify operation for verifying whether the test transistor LVN has broken down after the stress operation may be performed on the test transistor LVN multiple times until the test transistor LVN breaks down.

Next, referring to FIG. 6, after the completion of the stress operation and the verify operation described above with reference to FIGS. 4 and 5, the protection switch enable signal nEN1 may have the value of logic high. Accordingly, the protection switch HVN1 may be turned on to shortcircuit the input node Vgn and the ground node Gnd. In other words, the four nodes (e.g., the gate, the source, the drain and the body) of the test transistor LVN may be connected to the ground node Gnd, thereby reducing or preventing leakage current from flowing through the test transistor LVN that has broken down, more surely reducing or preventing the damage to the main circuit 20, and also reducing or preventing degradation of quality of the TDDB characteristic test due to noise caused by the leakage current.

The TDDB characteristic test on the test transistor LVN may be performed multiple times as described in FIGS. 4 through 6, but may be implemented in various ways. The stress operation for applying the stress voltage Vstress to the voltage application node Vin and the verify operation for checking the state of the test transistor LVN may be performed repeatedly until the test transistor LVN breaks down. In each iteration, for example, the stress operation for applying the stress voltage Vstress to the voltage application node Vin may be performed separately before the verify operation for applying a verify voltage different from the stress voltage Vstress to the voltage application node Vin. Alternatively, the stress operation for applying the stress voltage Vstress to the voltage application node Vin and the verify operation for checking the state of the test transistor LVN may be performed simultaneously.

Figure 7:
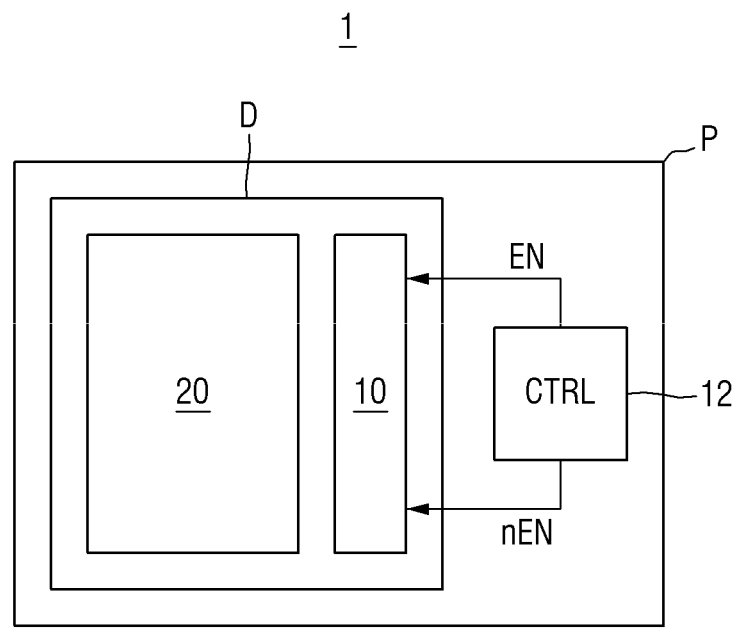
FIG. 7 is a schematic view of a semiconductor device according to some example embodiments.

FIG. 7 is a schematic view of a semiconductor device according to some example embodiments.

Referring to FIG. 7, the semiconductor device according to some example embodiments may further include a peripheral area P, in addition to a die D having a test circuit 10 and a main circuit 20.

A control circuit 12 may be disposed in the peripheral area P. The control circuit 12 may generate the input switch enable signal EN and the protection switch enable signal nEN described above with reference to FIGS. 3 through 6 and provide the input switch enable signal EN and the protection switch enable signal nEN to the test circuit 10.

In FIG. 7, the control circuit 12 generates the input switch enable signal EN and the protection switch enable signal nEN and provide the input switch enable signal EN and the protection switch enable signal nEN to the test circuit 10. However, the inventive concepts are not limited to this case. For example, the control circuit 12 may generate only one of the input switch enable signal EN and the protection switch enable signal nEN and generate the other signal by passing the generated signal through a circuit element such as an inverter.

Figure 8:
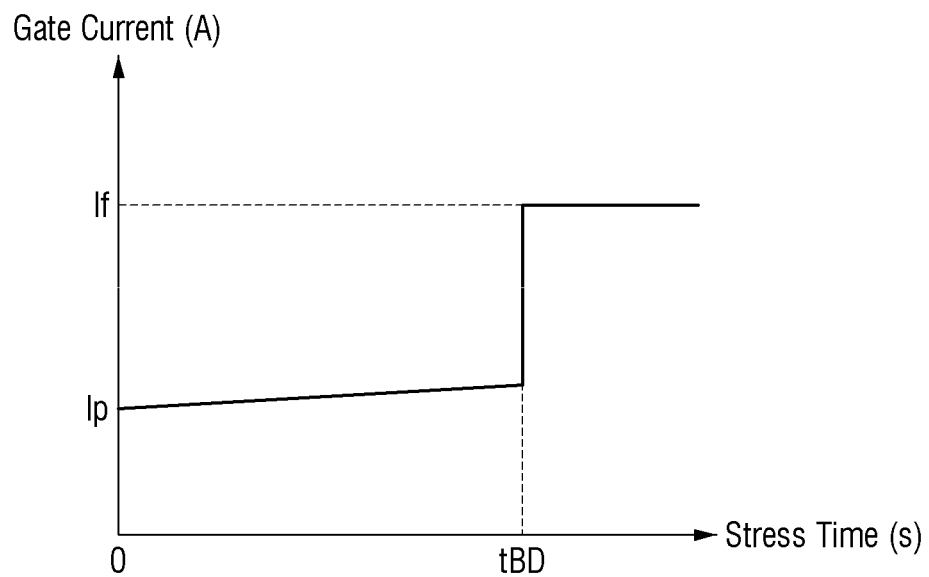
FIGS. 8 and 9 are diagrams for explaining an example of a method of estimating a breakdown time using a semiconductor device according to some example embodiments.
Figure 9:
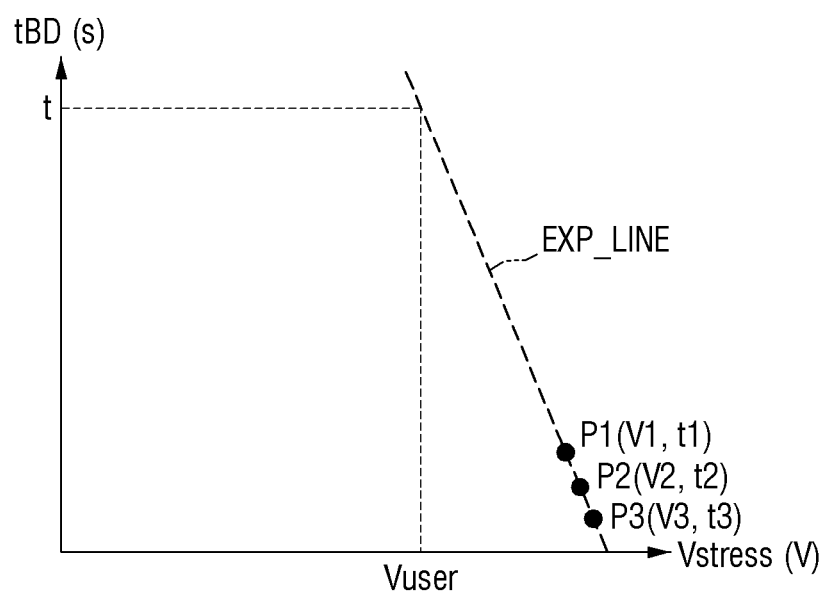

FIGS. 8 and 9 are diagrams for explaining an example of a method of estimating a breakdown time using a semiconductor device according to some example embodiments.

FIG. 8 is a graph illustrating gate current with respect to stress time. A time tBD indicates a time when a test transistor LVN breaks down.

Before the time tBD, the gate current of the test transistor LVN has a value corresponding to the level of a pass current Ip because the test transistor LVN has not broken down. However, after the time tBD, the value of the gate current of the test transistor LVN rapidly increases to the level of a fail current If because the test transistor LVN has broken down. Based on this change in gate current, it is possible to determine whether the test transistor LVN has broken down.

FIG. 9 is a graph illustrating breakdown time with respect to stress voltage. In this drawing, the horizontal axis representing the stress voltage and the vertical axis representing the breakdown time may be expressed as log scales.

If the test circuit 10 described above applies different stress voltages V1 through V3 and measures the values of breakdown times t1 through t3 respectively corresponding to the stress voltages V1 through V3, it is possible to produce a trend line EXP_LINE by extrapolating from data P1 through P3 obtained from the measured values and also possible to estimate a breakdown time tin the case of operation at a user voltage Vuser.

Some example embodiments in which different stress voltages are applied to test transistors so as to obtain data on breakdown times will now be described with reference to FIG. 10.

Figure 10:
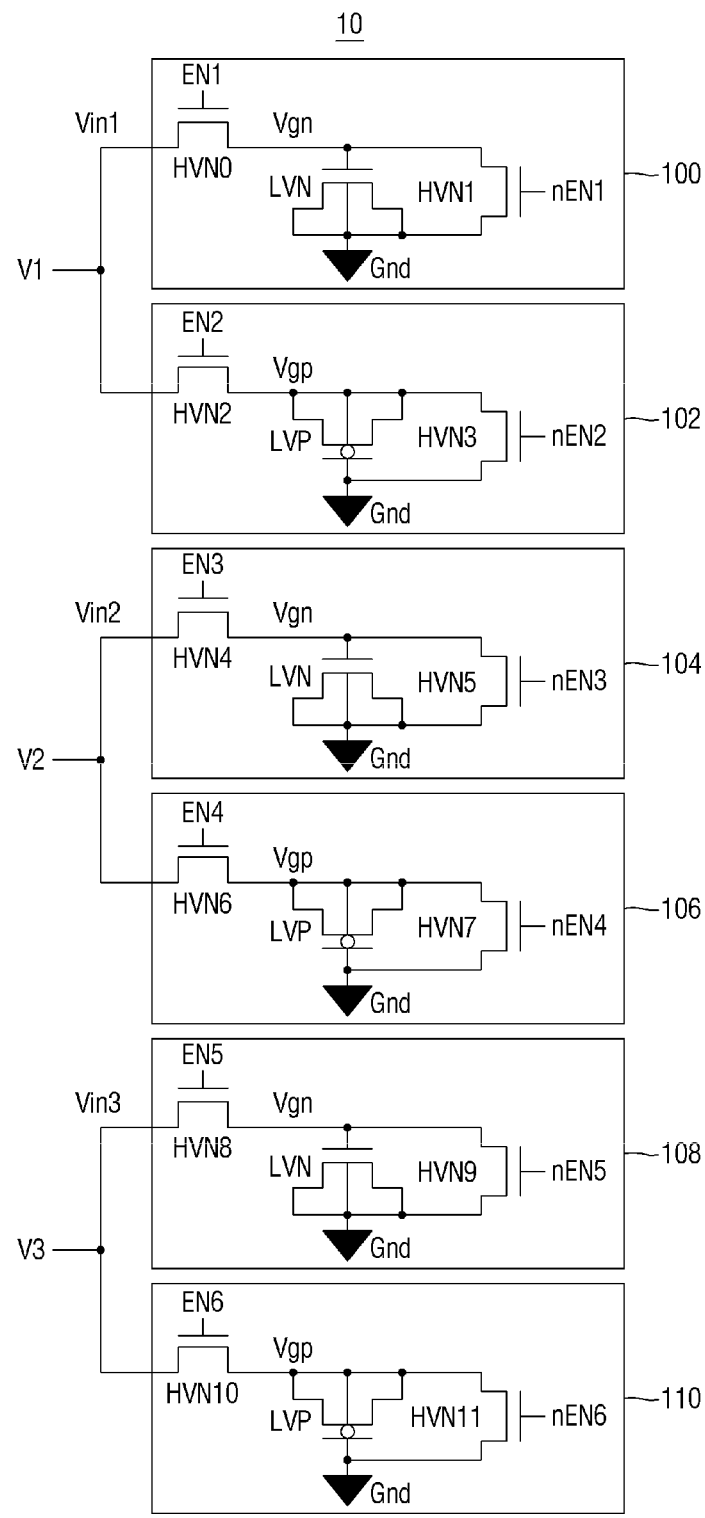
FIG. 10 is a circuit diagram of a semiconductor device according to some example embodiments.

FIG. 10 is a circuit diagram of a semiconductor device according to some example embodiments.

Referring to FIG. 10, a test circuit 10 includes a first test pattern 100 including a first input switch HVN0 and a first protection switch HVN1 and a second test pattern 104 including a second input switch HVN4 and a second protection switch HVN5. In addition, the test circuit 10 includes a third test pattern 108 including a third input switch HVN8 and a third protection switch HVN9.

Since a description of the test patterns 100, 104 and 108 is applicable to the configuration and operation of test patterns 102, 106 and 110 as in FIG. 3, a redundant description will be omitted, and only the test patterns 100, 104 and 108 will be described in detail.

In the first test pattern 100, the first input switch HVN0 is disposed between a first voltage application node Vin1 to which a first stress voltage V1 is applied and a first input node Vgn which transmits the first stress voltage V1 to a first test transistor LVN. The first protection switch HVN1 is disposed between the first input node Vgn and a first ground node Gnd.

In this case, the first input switch HVN0 may include a transistor gated to a first input switch enable signal EN1, the first protection switch HVN1 may include a transistor gated to a first protection switch enable signal nEN1, and the first protection switch enable signal nEN1 may be an inverted signal of the first input switch enable signal EN1. In addition, each of the first input switch HVN0 and the first protection switch HVN1 may include a gate oxide layer thicker than a gate oxide layer of the first test transistor LVN.

In the second test pattern 104, the second input switch HVN4 is disposed between a second voltage application node Vin2 to which a second stress voltage V2 is applied and a second input node Vgn which transmits the second stress voltage V2 to a second test transistor LVN. The second protection switch HVN5 is disposed between the second input node Vgn and a second ground node Gnd.

In this case, the second input switch HVN4 may include a transistor gated to a second input switch enable signal EN3, the second protection switch HVN5 may include a transistor gated to a second protection switch enable signal nEN3, and the second protection switch enable signal nEN3 may be an inverted signal of the second input switch enable signal EN3. In addition, each of the second input switch HVN4 and the second protection switch HVN5 may include a gate oxide layer thicker than a gate oxide layer of the second test transistor LVN.

In the third test pattern 108, the third input switch HVN8 is disposed between a third voltage application node Vin3 to which a third stress voltage V3 is applied and a third input node Vgn which transmits the third stress voltage V3 to a third test transistor LVN. The third protection switch HVN9 is disposed between the third input node Vgn and a third ground node Gnd.

The third input switch HVN8 may include a transistor gated to a third input switch enable signal EN5, the third protection switch HVN9 may include a transistor gated to a third protection switch enable signal nEN5, and the third protection switch enable signal nEN5 may be an inverted signal of the third input switch enable signal EN5. In addition, each of the third input switch HVN8 and the third protection switch HVN9 may include a gate oxide layer thicker than a gate oxide layer of the third test transistor LVN.

As described above with reference to FIGS. 3 through 6, the stress voltages V1 through V3 may be received from a voltage generator circuit 180 or a chip pad 190.

The test circuit 10 may obtain the data P1 through P3 described in FIG. 9 by using these test patterns 100, 104 and 108.

Figure 11:
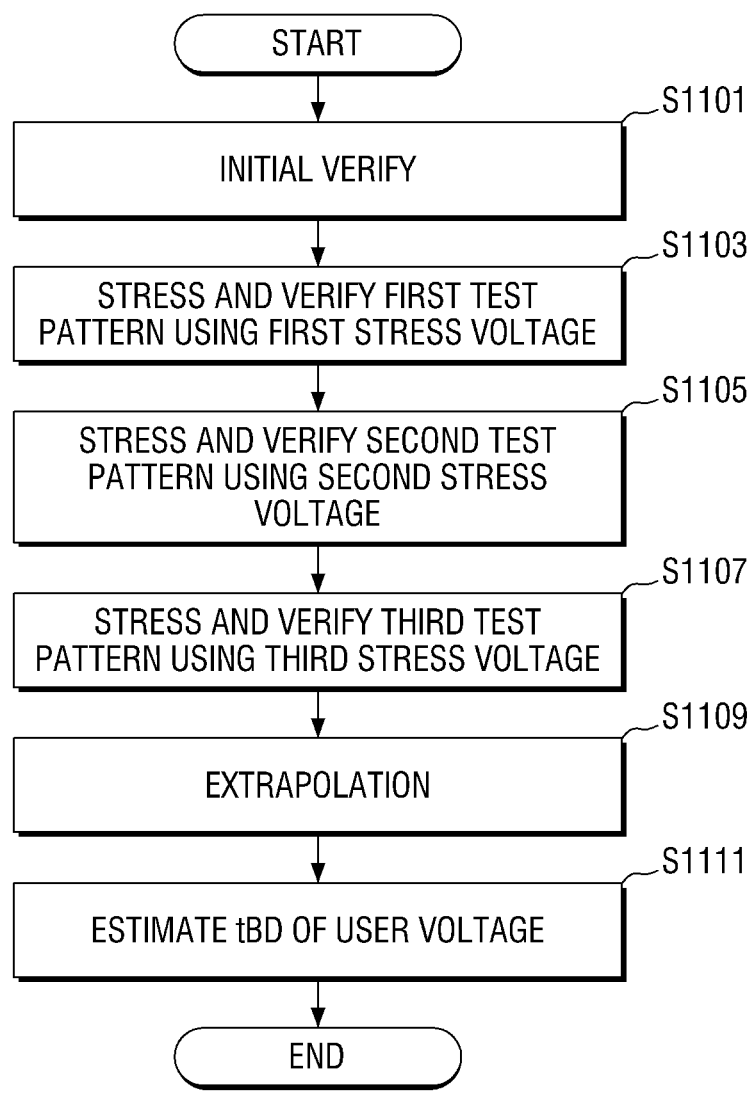
FIG. 11 is a flowchart illustrating a method of operating a semiconductor device according to some example embodiments.
Figure 12:
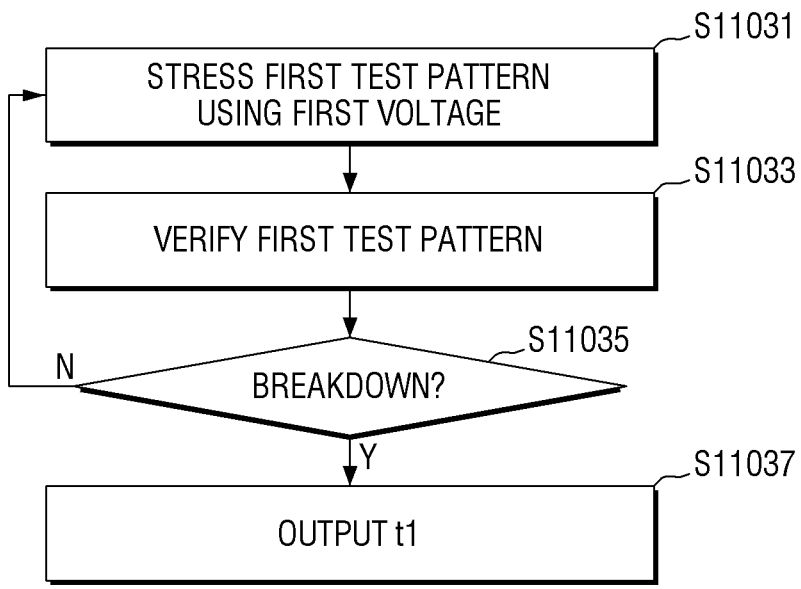
FIG. 12 is a flowchart illustrating a method of operating a semiconductor device according to some example embodiments.
Figure 13:
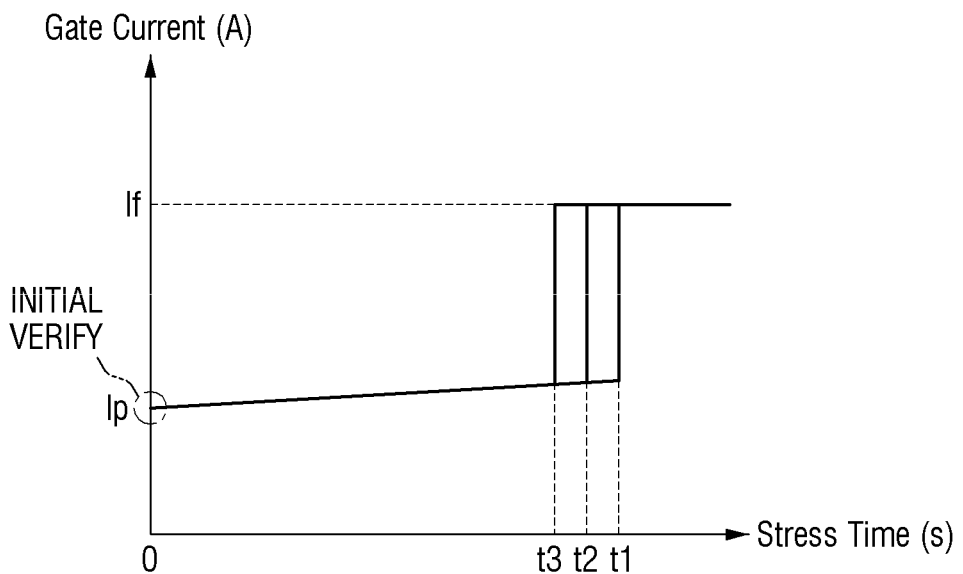
FIG. 13 is a diagram for explaining a method of operating a semiconductor device according to some example embodiments.

FIG. 11 is a flowchart illustrating a method of operating a semiconductor device according to some example embodiments. FIG. 12 is a flowchart illustrating a method of operating a semiconductor device according to some example embodiments. FIG. 13 is a diagram for explaining a method of operating a semiconductor device according to some example embodiments.

Referring to FIG. 11, the method of operating a semiconductor device according to some example embodiments includes performing an initial verify operation (operation S1101). The initial verify operation is intended to determine whether a test transistor LVN itself has a defect (for example, whether the test transistor LVN is defective) and may be selectively performed according to the test purpose.

Next, the method includes performing a stress operation and a verify operation, for example, on a first test transistor LVN of a first test pattern 100 using a first stress voltage V1 (operation S1103). For the stress operation and the verify operation, a first input switch HVN0 disposed between a first voltage application node Vin1 and a first input node Vgn is turned on.

Here, referring also to FIG. 12, operation S1103 includes obtaining a first breakdown time t1 of the first test transistor LVN by repeatedly performing the stress operation on the first test transistor LVN (operation S11031) and the verify operation on the first test transistor LVN (operation S11033) sequentially until the first test transistor LVN breaks down (operation S11035). After the completion of the stress operation and the verify operation, a first protection switch HVN1 disposed between the first input node Vgn and a first ground node Gnd is turned on to reduce or prevent leakage current from flowing through the broken down first test transistor LVN.

Next, the method includes performing a stress operation and a verify operation, for example, on a second test transistor LVN of a test pattern 104 using a second stress voltage V2 (operation S1105). For the stress operation and the verify operation, a second input switch HVN4 disposed between a second voltage application node Vin2 and a second input node Vgn is turned on.

Here, as in the case of operation S1103 of FIG. 12, operation S1105 includes obtaining a second breakdown time t2 of the second test transistor LVN by repeatedly performing the stress operation on the second test transistor LVN and the verify operation on the second test transistor LVN sequentially until the second test transistor LVN breaks down. After the completion of the stress operation and the verify operation, a second protection switch HVN5 disposed between the second input node Vgn and a second ground node Gnd is turned on to reduce or prevent leakage current from flowing through the broken down second test transistor LVN.

Next, the method includes performing a stress operation and a verify operation, for example, on a third test transistor LVN of a test pattern 108 using a third stress voltage V3 (operation S1107). For the stress operation and the verify operation, a third input switch HVN8 disposed between a third voltage application node Vin3 and a third input node Vgn is turned on.

Here, as in the case of operation S1103 of FIG. 12, operation S1107 includes obtaining a third breakdown time t2 of the third test transistor LVN by repeatedly performing the stress operation on the third test transistor LVN and the verify operation on the third test transistor LVN sequentially until the third test transistor LVN breaks down. After the completion of the stress operation and the verify operation, a third protection switch HVN9 disposed between the third input node Vgn and a third ground node Gnd is turned on to reduce or prevent leakage current from flowing through the broken down third test transistor LVN.

Next, the method includes performing extrapolation based on the first through third breakdown times t1 through t3 (operation S1109) and estimating a breakdown time for a user voltage Vuser by using a trend line corresponding to the extrapolation result (operation S1111).

Referring to FIG. 13, the values of gate currents of first through third transistors rapidly increase from the level of the pass current Ip to the level of the fail current If at times t1 through t3, respectively. Therefore, it may be seen that the first through third transistors have broken down at the times t1 through t3, respectively.

Figure 14:
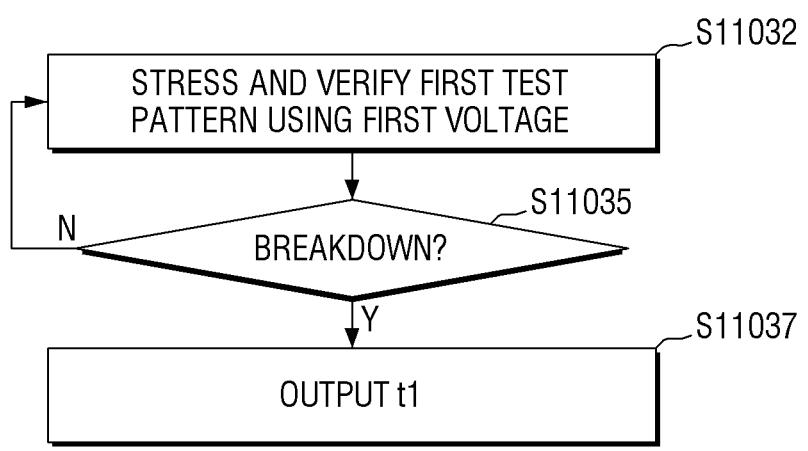
FIG. 14 is a flowchart illustrating a method of operating a semiconductor device according to some example embodiments.

FIG. 14 is a flowchart illustrating a method of operating a semiconductor device according to some example embodiments.

Referring to FIG. 14, operation S1103 of FIG. 11 includes simultaneously performing a stress operation on a first test transistor LVN and a verify operation on the first test transistor LVN (operation S11032), unlike operations S11031 and S11033 of FIG. 12. That is, operation S1103 may be implemented in such a manner that the state of the first test transistor LVN is checked while a stress voltage Vstress is being applied to the first test transistor LVN.

Even in this case, after the completion of the stress operation and the verify operation performed simultaneously, the above-described method may be performed to reduce or prevent leakage current from flowing through the first test transistor LVN.

According to the example embodiments described above, it is possible to form a test circuit for testing TDDB characteristics on a die in an on-chip manner while reducing or preventing damage to an adjacent main circuit. Accordingly, as many data as the number of dies may be obtained, thus enabling a TDDB characteristic test to be performed more accurately and precisely.

In addition, since a stress voltage Vstress may be provided to a test transistor LVN exactly at a desired time, the accuracy of the TDDB characteristic test may be further increased.

Moreover, it is possible to more surely reduce or prevent the damage to a main circuit 20 by reducing or preventing leakage current from flowing through the test transistor LVN that has broken down and also possible to reduce or prevent degradation of quality of the TDDB characteristic test due to noise caused by the leakage current.

In concluding the detailed description, those skilled in the art will appreciate that many variations and modifications may be made to the example embodiments without substantially departing from the principles of the inventive concepts. Therefore, the example embodiments of the inventive concepts are used in a generic and descriptive sense only and not for purposes of limitation.

What is claimed is:

1. A semiconductor device comprising:
a test circuit including
a test transistor to be tested for time-dependent dielectric breakdown (TDDB) characteristics using a stress voltage,
an input switch electrically connected between a voltage application node to which the stress voltage is applied and an input node electrically connected to the test transistor, and
a protection switch electrically connected between the input node and a ground node.

2. The semiconductor device of claim 1, wherein
the input switch comprises a first transistor gated by an input switch enable signal,
the protection switch comprises a second transistor gated by a protection switch enable signal, and
the protection switch enable signal is an inverted signal of the input switch enable signal.

3. The semiconductor device of claim 2, wherein the input switch comprises a first gate oxide layer which is thicker than a second gate oxide layer of the test transistor.

4. The semiconductor device of claim 2, wherein the protection switch comprises a first gate oxide layer which is thicker than a second gate oxide layer of the test transistor.

5. The semiconductor device of claim 2, further comprising:
a control circuit in a peripheral area outside the test circuit, the control circuit configured to provide the input switch enable signal and the protection switch enable signal.

6. The semiconductor device of claim 1, further comprising:
a voltage generator circuit configured to apply the stress voltage to the voltage application node, wherein the test circuit further comprises a first switch electrically connected between the voltage generator circuit and the voltage application node.

7. The semiconductor device of claim 6, wherein the first switch comprises a transistor comprising a first gate oxide layer which is thicker than a second gate oxide layer of the test transistor.

8. The semiconductor device of claim 1, further comprising:
a chip pad configured to apply a user stress voltage received from an external source to the voltage application node, wherein the test circuit further comprises a second switch electrically connected between the chip pad and the voltage application node.

9. The semiconductor device of claim 8, wherein the second switch comprises a transistor comprising a first gate oxide layer which is thicker than a second gate oxide layer of the test transistor.

10. The semiconductor device of claim 1, further comprising:
a main circuit disposed on a die, wherein the test circuit is disposed on the die and is electrically isolated from the main circuit.

11. A semiconductor device comprising:
a test circuit including
a test transistor to be tested for TDDB characteristics using a stress voltage, and
an input switch electrically connected between a voltage application node to which the stress voltage is applied and an input node electrically connected to the test transistor; and
a main circuit adjacent to the test circuit and electrically isolated from the test circuit,
wherein the input switch includes a first transistor gated by an input switch enable signal, and the input switch includes a first gate oxide layer which is thicker than a second gate oxide layer of the test transistor.

12. The semiconductor device of claim 11, wherein the test circuit further comprises a protection switch between the input node and a ground node.

13. The semiconductor device of claim 12, wherein the protection switch comprises a second transistor gated by a protection switch enable signal, and the protection switch enable signal is an inverted signal of the input switch enable signal.

14. The semiconductor device of claim 13, wherein the protection switch comprises a first gate oxide layer which is thicker than a second gate oxide layer of the test transistor.

15. The semiconductor device of claim 11, further comprising:
a voltage generator circuit configured to apply the stress voltage to the voltage application node, wherein the test circuit further comprises a first switch electrically connected between the voltage generator circuit and the voltage application node.

16. The semiconductor device of claim 15, wherein the first switch comprises a transistor comprising a first gate oxide layer which is thicker than a second gate oxide layer of the test transistor.

17. The semiconductor device of claim 11, further comprising:
a chip pad configured to apply a user stress voltage received from an external source to the voltage application node, wherein the test circuit further comprises a second switch electrically connected between the chip pad and the voltage application node.

18. A semiconductor device comprising:
a test circuit including
a first test pattern comprising a first input switch and a first protection switch, and
a second test pattern comprising a second input switch and a second protection switch; and
a main circuit on a die, the main circuit configured to operate a chip,
wherein
the test circuit is on the die and is electrically isolated from the main circuit,
the first input switch is electrically connected between a first voltage application node to which a first stress voltage is applied and a first input node electrically connected to a first test transistor to be tested for TDDB characteristics,
the first protection switch is electrically connected between the first input node and a first ground node,
the second input switch is electrically connected between a second voltage application node to which a second stress voltage different from the first stress voltage is applied and a second input node configured to transmit the second stress voltage to a second test transistor to be tested for the TDDB characteristics, and
the second protection switch is electrically connected between the second input node and a second ground node.

* * * * *